United States Patent [19]
Feinberg et al.

[11] Patent Number: 5,060,114
[45] Date of Patent: Oct. 22, 1991

[54] CONFORMABLE PAD WITH THERMALLY CONDUCTIVE ADDITIVE FOR HEAT DISSIPATION

[75] Inventors: Jay H. Feinberg, Deerfield; William N. Roberts, Niles, both of Ill.

[73] Assignee: Zenith Electronics Corporation

[21] Appl. No.: 533,971

[22] Filed: Jun. 6, 1990

[51] Int. Cl.$^5$ ............................................. H05K 7/20
[52] U.S. Cl. .................................. 361/387; 361/386; 361/388; 361/424; 165/185
[58] Field of Search ............... 361/386, 387, 388, 389, 361/424; 174/35 R, 35 MS, 35 GC, 16.3; 522/148; 428/252; 165/185; 357/81, 84

[56] References Cited

U.S. PATENT DOCUMENTS

| | | | |
|---|---|---|---|
| 4,029,999 | 6/1977 | Neumann et al. | 361/386 |
| 4,654,754 | 3/1987 | Daszkowski | 361/388 |
| 4,747,019 | 5/1988 | Ito et al. | 361/424 |
| 4,886,700 | 12/1989 | Younes | 428/252 |
| 4,914,143 | 4/1990 | Patel | 522/148 |
| 4,926,291 | 5/1990 | Sarraf | 361/384 |
| 4,959,752 | 9/1990 | Samarov et al. | 361/424 |

*Primary Examiner*—Leo P. Picard
*Assistant Examiner*—Young S. Whang

[57] ABSTRACT

A conformable, gel-like pad, preferably of silicone, with a thermally conductive additive conducts heat away from a packaged electronic power device with which it is in contact. Formed by adding particles of a thermally conductive material such as aluminum powder, nickel, aluminum oxide, iron oxide, beryllium oxide, silver, etc., to a mixture of silicone resins and curing agents poured into a mold, the molded pad can be formed to accommodate virtually any geometry and size of electronic component to provide a custom-fit at little cost. A thin, solid sheet of a thermally conductive metal such as aluminum positioned in contact with a surface of the conformable pad further increases heat removal. Another embodiment contemplates a metallic foil disposed in contact with a surface of or within the conformable pad and extending therefrom which can be coupled to a heat sink or to neutral ground potential for radiation shielding. A metallic radiation shield box may be used as a mold for forming the conformable pad and to form a combination EMI/RFI radiation shield and heat transfer device for an electronic component disposed within the box and in contact with the conformable pad.

16 Claims, 3 Drawing Sheets

CONFORMABLE PAD WITH THERMALLY CONDUCTIVE ADDITIVE FOR HEAT DISSIPATION

BACKGROUND OF THE INVENTION

This invention relates generally to the transfer of heat away from a hot body and is particularly directed to a conformable pad containing a thermally conductive material for removing heat from a packaged electronic device with which the pad is in contact.

Electronic circuitry and components generate heat during operation. Removal of this heat is critical for stable operation and long operating lifetimes. As circuit packaging densities increase, efficient heat removal has become even more critical.

Heat is removed from electronic devices by various means such as cooling fans, heat sinks, and bimetallic cooling arrangements, to name a few. Cooling fans require their own circuitry and thus increase the complexity and expense of the electronic apparatus. Heat sinks may be either of the metallic type such as comprised of aluminum or of the conformable type. Typically metallic sinks are mechanically attached to the electronic device from which heat is to be removed by means of thermally conductive greases, films or adhesives. Because of their rigid structure, thermal coupling between the electronic device and the metallic heat sink is generally limited to the planar surfaces of contact between the heat sink and electronic device. In order to increase the surface area of contact with the electronic device, some heat sinks are comprised of a conformable plastic pouch hermetically filled with an inert thermally conductive fluid. Although increasing the efficiency of heat transfer and removal, these latter heat sinks are subject to leakage of the thermally conductive fluid which not only ends heat dissipation by the device, but also contaminates the electronic apparatus with the thus leaked fluid. Leakage of the materials which are typically used in such conformable plastic pouch heat sinks, e.g., fluorinated compounds, is particularly undesirable from environmental considerations.

The aforementioned approaches to dissipating heat from electronic devices are intended for use in specific applications. For example, when several flat integrated circuits (ICs) are located on a single printed circuit (PC) board and contained in a metallic box to prevent electromagnetic interference (EMI) and radio frequency interference (RFI) radiation, the box sometimes is also used as a heat sink. However, a problem arises in thermally coupling the IC packages to the box. Because the volume of the box is generally too small to allow for fins or other conventional heat sink devices, the use of a conformable plastic pouch is sometimes required. However, these conformable plastic pouch heat sinks suffer from the leakage problem discussed above and are expensive, and the configuration of the metal box may require a custom-fitted, plastic pouch which further increases the cost. Providing the outer film layer of the conformable plastic pouch with an aluminum foil to attenuate EMI/RFI radiation renders the use of these conformable heat sink pouches too expensive for most industrial and consumer electronic devices.

OBJECTS OF THE INVENTION

Accordingly, it is an object of the present invention to remove heat from a packaged electronic device by conduction.

It is another object of the present invention to remove heat from a hot body by means of a conformable pad placed in intimate contact with the body and containing heat conducting particles dispersed throughout.

Another object of the present invention is to provide a gel-like heat transfer structure closely conformable to the size and shape of a packaged electronic device for removing heat from the device.

Yet another object of the present invention is to provide a heat transfer body for encapsulating a packaged electronic device and removing heat therefrom which also serves as an EMI/RFI radiation shield for the device.

A further object of the present invention is to provide an inexpensive, gel-like thermal transfer medium which can be custom-fitted for a packaged electronic device for heat removal via conduction.

A still further object of the present invention is to provide a heat transfer body for removal of heat from a packaged electronic device which is not subject to rupture and the loss of thermal conductivity and the release of contaminants.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENTS

Figure 1:
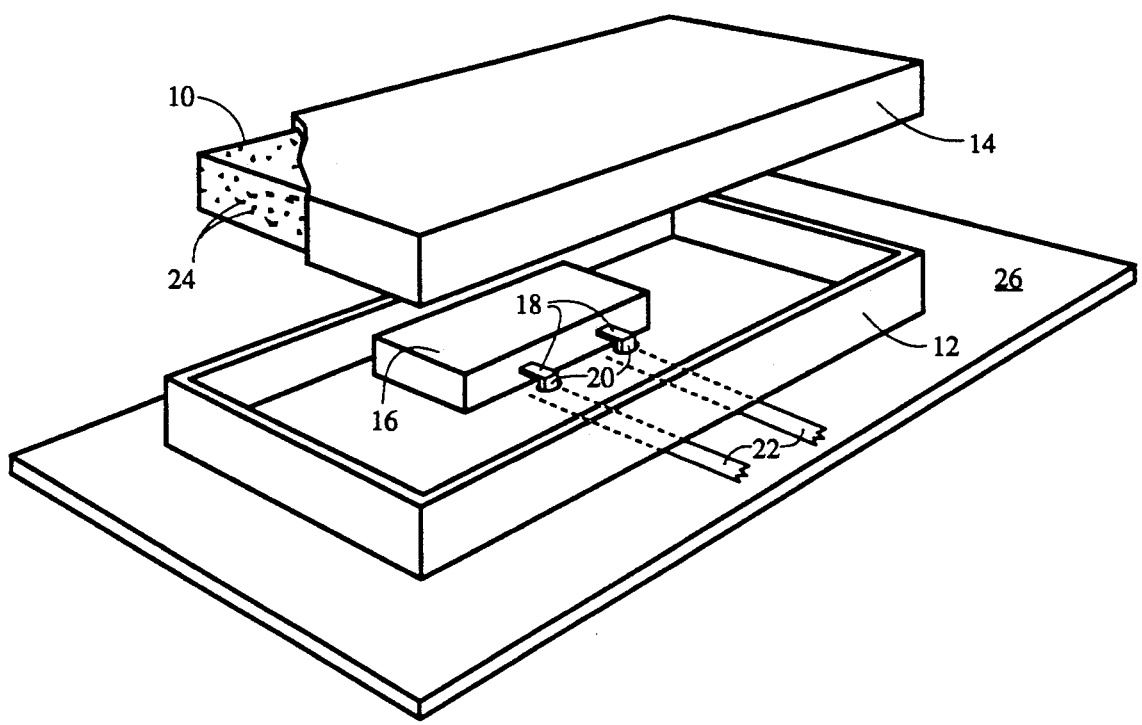
FIG. 1 is an exploded perspective view of a thermally conductive silicone pad incorporated in the top of a metal shield box for use with a packaged electronic component for heat dissipation and EMI/RFI shielding in accordance with one embodiment of the present invention.

Referring to FIG. 1, there is shown an exploded perspective view of a conformable silicone pad 10 for use in removing heat from a packaged electronic device 16 with which it is in contact. The conformable pad 10 is comprised of a gel-like material such as silicone resin which is formed by pouring the resin into an inverted metal shield top 14. Other conformable materials such as polyurethane in foam or gel form may also be used to form the pad structure, with silicone being the preferred material. After pouring the silicone resin into the metal shield top 14, the silicone is allowed to cure and the metal shield top is then positioned over a metal shield bottom 12 disposed on and coupled to a printed circuit (PC) board 26. The combined metal shield bottom and top 12, 14 forms a closed EMI/RFI shield for the packaged electronic device 16 disposed therein. The metal shield, which preferably is comprised of a conductive metal such as copper or nickel, confines EMI and RFI generated by the electronic device 16. Coupled to the electronic device 16 are a pair of leads 18 which are each coupled via a respective lead connection 20 under the metal shield bottom 12 to a respective external conductor 22. The lead connections 20 allow the electronic device 16 to be electrically coupled to circuitry (not shown) on the PC board 26. In this arrangement, only the device is encapsulated. The circuitry is covered by solder mask, and passes under the metal shield.

In accordance with the present invention, the conformable, silicone pad 10 includes thermal conductive elements 24 dispersed therein. The thermal conductive elements 24 may be comprised of various heat conducting materials such as aluminum powder, nickel, aluminum oxide, iron oxide, beryllium oxide, silver, silver coated copper spheres, etc., which are added to the silicone resin material prior to curing with aluminum powder preferred. The heat conducting particles are preferably in the form of flakes. The compressibility and flexibility of the silicone pad 10 allows it to closely conform to the size and outer shape of the electronic device 16 when placed in contact with the device when the metal shield top 14 is positioned upon the metal shield bottom 12. By engaging the electronic device 16 in a close fitting, encapsulating manner, the conformable silicone pad 10 conducts heat away from the electronic device to the metal shield structure in dissipating thermal energy. The depth of the metal shield top 14 is sufficient so that the silicone resin material poured into the top is in contact with the electronic device 16 when the top is positioned upon the metal shield bottom 12. The metal shield top 14 thus serves as the conformable silicone pad forming and curing mold. The shield bottom and top portions 12, 14 may be coupled together in a snap-acting manner or by other conventional means.

Figure 2:
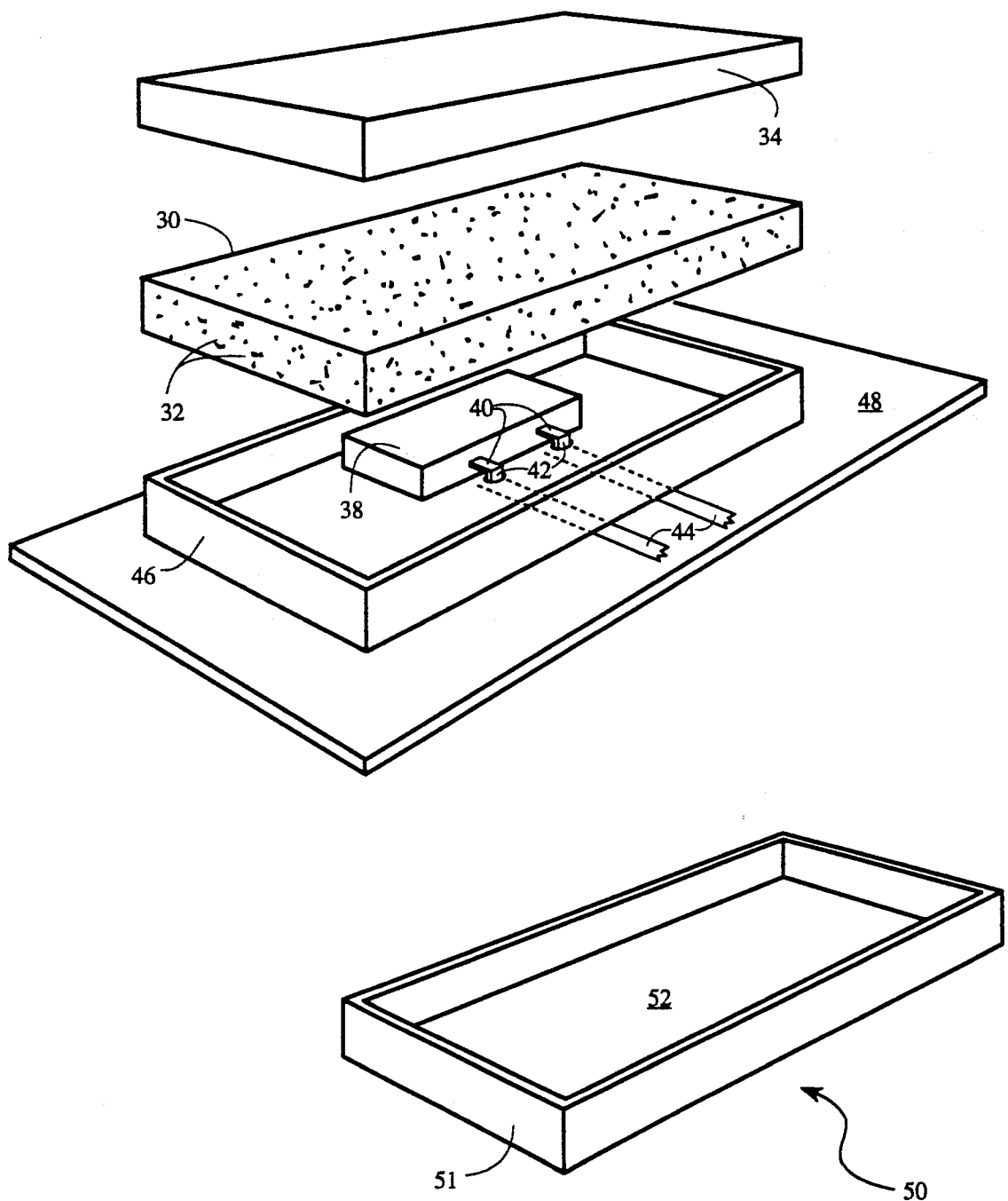
FIG. 2 is an exploded perspective view of another embodiment of a conformable silicone pad formed by means of a separate mold and then inserted in a metal box for heat dissipation and EMI/RFI shielding.

Referring to FIG. 2, there is shown another embodiment for forming a heat transfer silicone pad 30 in accordance with the present invention. As in the previous case, a metal shield bottom 46 positioned upon and coupled to a PC board 48 has positioned therein an electronic device 38. The electronic device 38 has a pair of leads 40 extending therefrom, each of which is coupled by means of a respective lead connection 42 to a respective external conductor 44. The lead connections 42 include apertures within the metal shield bottom 46 to permit the electronic device leads 40 to be coupled to other circuitry (not shown) on the PC board 48 via external conductors 44. The silicone pad 30 is formed by depositing a silicone resin in fluid form in a form 50 comprised of a plastic frame (e.g. DELRON TM) 51 and a TEFLON TM -coated, glass plate bottom 52. The surface characteristics of the DELRON TM frame 51 and the TEFLON TM coating of the frame's glass bottom 52 facilitates removal of the silicone pad 30 following curing from the form 50. Once removed from the form, the silicone pad 30 is inserted in the metal shield bottom 46 and over the electronic device 38. A metal shield top 34 is then positioned over the combination of metal shield bottom 46 and silicone pad 30 to form an EMI/RFI shield as well as a heat dissipation structure for the electronic device 38. As in the previous embodiment, the silicone pad 30 includes a large number of thermal conductive elements 32 dispersed throughout the pad. Each of these conductive elements 32 has a high heat transfer characteristic to facilitate transmission of heat from the electronic device 38 to the metal shield.

Figure 3:
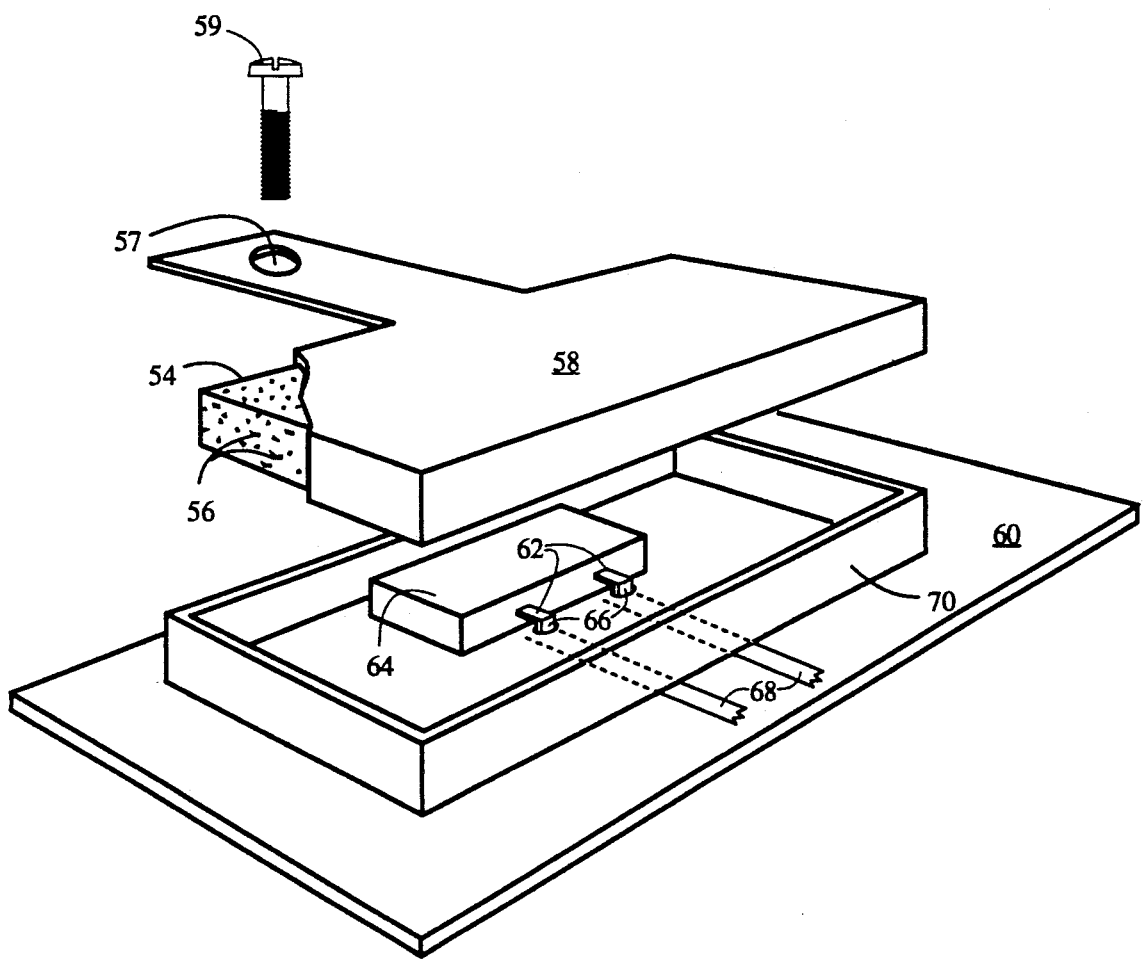
FIG. 3 is an exploded perspective view of a thermally conductive silicone pad arrangement incorporating a thin metallic foil for providing a grounded EMI/RFI shield.

Referring to FIG. 3, there is shown an exploded perspective view of yet another embodiment of an EMI/RFI shield and heat transfer arrangement in accordance with the present invention. As in the previous embodiments, a metal shield bottom 70 is positioned upon and attached to a PC board 60. The metal shield bottom 70 includes a plurality of lateral walls and a base so as to form a structure having an open upper portion. A silicone pad 54 having a plurality of thermal conductive elements 56 dispersed throughout is adapted for tight-fitting insertion in the metal shield bottom 70. When inserted in the metal shield bottom, the silicone pad 54 is in intimate contact with the electronic device 64, with the flexibility and the compressibility of the silicone pad permitting it to conform to the size and configuration of the upper and lateral sides of the electronic device. Disposed over the silicone pad 54 is a copper foil 58 having a tab 58a extending therefrom. The copper foil 58, in combination with the metal shield bottom 70, forms an EMI/RFI shield for confining radiation generated by the electronic device 64, and also facilitates dissipation of thermal energy of the electronic device transferred to the copper foil and metal shield bottom 70 via the thermal conductive elements 56 within the silicone pad 54. Tab 58a allows the copper foil 58 to be grounded via conventional coupling means such as a threaded coupler 59 inserted through an aperture 57 within the tab. In some situations, it may be necessary to ground the copper foil 58 to ensure its effectiveness as an EMI/RFI shield for the electronic device 64 disposed within the copper foil. In another embodiment, the tab 58a may be coupled to another thermal dissipation device such as a metallic heat sink (not shown) for enhanced heat dissipation from the electronic device 64. In still another embodiment, a tab may extend from the metal housing of FIGS. 1 or 2 for coupling either to a heat sink or to neutral ground potential.

The silicone pad 54 is comprised of a combination of resins and catalysts which provide a pad having optimum mechanical characteristics in terms of compressibility and flexibility for use with a packaged electronic device. The composition of the silicone pad 54 in a preferred embodiment is given by Table I in terms of the quantity in grams and preferred percentage range of the various constituents. As shown in Table I, the silicone pad 54 is produced by mixing Part A with Part B in a ratio of 25:20, pouring the mixture into a mold, and curing in an oven at 100° C. for 15–30 minutes.

TABLE I

| Material | Quantity in Grams | Preferred Range % |
|---|---|---|
| PART A | | |
| Sylgard 184 base resin | 10 | 20–40 |
| Sylgard 527-A resin | 15 | 60–80 |
| PART B | | |
| Sylgard 184 catalyst | 0.3 | 1–2 |
| Sylgard 527-B catalyst | 19.7 | 98–99 |

The use of a conformable silicone pad having thermal conductive elements distributed throughout allows for the efficient removal of heat from a packaged electronic device with which it is in contact. By providing a uniformly cured silicone pad, the pad structure operates as a continuous, uniform thermal transfer medium without discontinuities arising from air bubbles and other anomalies. In addition, the silicone pad exhibits no shrinkage with increases in operating temperature and thus remains in intimate contact with its surrounding metallic shield as well with the electronic device for efficient heat transfer and dissipation. A thermally conductive film may be disposed intermediate the silicone pad and the electronic device from which heat is being removed as well as intermediate the silicone pad and the metallic shield. The thermally conductive film may include silica gel or mica. An optical coupler pad comprised of silicone is disclosed in U.S. Pat. No. 4,710,820 assigned to the assignee of the present application.

There has thus been shown a gel-like, conformable silicone pad with a thermally conductive additive for use with a packaged electronic device for dissipating heat. The silicone pad is comprised of a combination of resins and catalysts and possesses flexibility and compressibility to permit it to conform to the size and dimensions of a packaged electronic device with which it is in contact. While this invention is disclosed primarily as a silicone pad, other conformable materials such as polyurethane in either gel or foam form may also be used. The thermally conductive additive, which may be in the form of particles of aluminum, nickel, aluminum oxide, iron oxide, beryllium oxide, silver, silver coated copper spheres, etc., facilitates heat transmission from the inner surface of the silicone pad in contact with the electronic device to the outer surface of the pad. Disposed about and in intimate contact with the outer surface of the conformable silicone pad is a closed metal housing which receives heat from the pad and radiates it to the atmosphere and also serves as an EMI/RFI shield for confining radiation generated by the electronic device. The metal housing may be used as a mold for forming the silicone pad and may include a conductive tab extending therefrom for either grounding the shield or coupling the shield to another heat conducting element such as a heat sink.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. An arrangement for removing heat from a packaged electronic device positioned on a printed circuit (PC) board, said arrangement comprising:
   a conformable, gel-like pad having a first surface portion disposed in intimate contact with the packaged electronic and including a plurality of heat conducting particles disposed therein for transmitting heat from said first surface portion to a second surface portion thereof; and
   a metallic housing disposed about said pad and in intimate contact with the second surface portion thereof for removing heat from said pad.

2. The arrangement of claim 1 wherein said conformable, gel-like pad is comprised of silicone.

3. The arrangement of claim 1 wherein said conformable, gel-like pad is comprised of polyurethane.

4. The arrangement of claim 1 wherein said heat conducting particles are comprised of aluminum powder.

5. The arrangement of claim 1 wherein said heat conducting particles are comprised of a material from the group of nickel, aluminum oxide, iron oxide, beryllium oxide or silver.

6. The arrangement of claim 1 wherein said conformable, gel-like pad is comprised of a curable material and said heat conducting particles are introduced in said curable pad prior to the curing thereof and are suspended generally uniformly within and throughout said pad.

7. The arrangement of claim 1 wherein said metallic housing forms a closed structure for enclosing said pad and the electronic device and forms a radiation shield therefor.

8. The arrangement of claim 7 wherein a plurality of conductive leads are coupled to the electronic device and wherein said metallic housing includes lead-through connections for electrically coupling said conductive leads to circuitry on the PC board.

9. The arrangement of claim 7 wherein said metallic housing is coupled to a heat sink.

10. The arrangement of claim 9 wherein the metallic housing is comprised of an electrically conductive material to form a radiation shield.

11. The arrangement of claim 10 further comprising means for coupling said metallic housing to neutral ground potential.

12. The arrangement of claim 11 wherein said metallic housing is comprised of copper foil.

13. The arrangement of claim 11 wherein said pad is comprised of a curable material and said metallic housing is used as a form for holding said curable material during curing.

14. The arrangement of claim 1 further comprising a heat conducting film disposed intermediate said pad and the electronic device.

15. The arrangement of claim 14 further comprising a heat conducting film disposed intermediate said pad and said metallic housing.

16. An arrangement for removing heat from and shielding a packaged electronic device positioned on a printed circuit (PC) board, said arrangement comprising:
   a conformable, gel-like pad having a first surface portion disposed in intimate contact with the packaged electronic device and including a plurality of heat conducting particles disposed therein for transmitting heat from said first surface portion to a second surface portion thereof; and
   a metallic housing disposed about said pad and in intimate contact with the second surface portion thereof for removing heat from said pad, wherein said metallic housing is comprised of an electrically conductive material and forms a closed structure for enclosing said pad and the electronic device and forming a radiation shield therefor.

* * * * *